(12) United States Patent
Uncovsky et al.

(10) Patent No.: US 11,335,536 B2
(45) Date of Patent: May 17, 2022

(54) LIGHT GUIDE ASSEMBLY FOR AN ELECTRON MICROSCOPE

(71) Applicant: FEI Company, Hillsboro, OR (US)

(72) Inventors: Marek Uncovsky, Brno (CZ); Michal Geryk, Brno (CZ); Jan Lasko, Chocen (CZ)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 17/011,378

(22) Filed: Sep. 3, 2020

(65) Prior Publication Data

US 2021/0082659 A1 Mar. 18, 2021

(30) Foreign Application Priority Data

Sep. 16, 2019 (EP) .................................. 19197530

(51) Int. Cl.
*H01J 37/244* (2006.01)
*H01J 37/22* (2006.01)
*H01J 37/28* (2006.01)

(52) U.S. Cl.
CPC .......... *H01J 37/244* (2013.01); *H01J 37/226* (2013.01); *H01J 37/28* (2013.01); *H01J 2237/2448* (2013.01); *H01J 2237/24475* (2013.01); *H01J 2237/2608* (2013.01)

(58) Field of Classification Search
CPC ........ H01J 37/244; H01J 37/226; H01J 37/28; H01J 2237/24475; H01J 2237/2448; H01J 2237/2608; H01J 2237/2441; H01J 2237/2445; H01J 2237/2857; H01J 37/285; H01J 37/228; H01J 2237/2808; H01J 37/292; H01J 37/1475; H01J 37/1478; G01J 3/44; G01J 3/0216; G01J 3/0243; G01N 21/65
See application file for complete search history.

(56) References Cited

U.S. PATENT DOCUMENTS

| 6,885,445 B2 | 4/2005 | Bennett et al. |
| 7,589,322 B2 * | 9/2009 | Nishikata ............... H01J 37/228 250/306 |
| 7,718,979 B2 | 5/2010 | Knowles |
| 2003/0053048 A1 * | 3/2003 | Bennett ..................... G01J 3/02 356/301 |

(Continued)

FOREIGN PATENT DOCUMENTS

| CN | 108279247 B | 7/2019 |
| EP | 1739715 A2 | 1/2007 |

(Continued)

OTHER PUBLICATIONS

EP19197530.9, Extended Search Report, dated Apr. 8, 2020, 9 pages.

*Primary Examiner* — David A Vanore
(74) *Attorney, Agent, or Firm* — William R McCarthy, III

(57) ABSTRACT

An embodiment of electron microscope system is described that comprises an electron column pole piece and a light guide assembly operatively coupled together. The light guide assembly also includes one or more detectors, and a mirror with a pressure limiting aperture through which an electron beam from an electron source passes. The mirror is also configured to reflect light, as well as to collect back scattered electrons and secondary electrons.

26 Claims, 5 Drawing Sheets

(56) References Cited

U.S. PATENT DOCUMENTS

| | | | |
|---|---|---|---|
| 2008/0185509 A1* | 8/2008 | Knowles | H01J 37/256 250/251 |
| 2009/0242758 A1* | 10/2009 | Uncovsky | H01J 47/06 250/307 |
| 2012/0112062 A1* | 5/2012 | Novak | H01J 37/244 250/307 |
| 2013/0075604 A1* | 3/2013 | Bean | H01J 37/226 250/306 |
| 2013/0099116 A1* | 4/2013 | Stowe | H01J 37/244 250/310 |
| 2013/0140459 A1* | 6/2013 | Galloway | H01J 37/28 250/310 |
| 2015/0279616 A1 | 10/2015 | Jiruse et al. | |
| 2021/0082659 A1* | 3/2021 | Uncovsky | H01J 37/244 |

FOREIGN PATENT DOCUMENTS

| | | |
|---|---|---|
| EP | 2482061 A2 | 8/2012 |
| WO | WO-2015093465 A1 | 6/2015 |

* cited by examiner

LIGHT GUIDE ASSEMBLY FOR AN ELECTRON MICROSCOPE

CROSS-REFERENCE TO RELATED APPLICATIONS

The present application claims the priority benefit from EP Patent Application Serial No. 19197530.9, filed Sep. 16, 2019, which is hereby incorporated by reference herein in its entirety for all purposes.

FIELD OF THE INVENTION

The present invention is generally directed to an electron microscope enabled for Raman Spectroscopy and/or Cathodoluminescence detection.

BACKGROUND

It is generally appreciated that combining Raman Spectroscopy or Cathodoluminescence detection with electron microscopy has a number of advantages, particularly when used with what are generally referred to as Environmental Scanning Electron Microscope (ESEM) techniques. For example, Raman microscopy is useful for material identification and when combined with scanning electron microscopy one can specifically identify features of a sample that may have differing characteristics in composition and/or structure. ESEM techniques can operate in modes that enable imaging in low vacuum, relatively humid environments that reduces sample desiccation that produces movement of the sample reducing image resolution. However, it is also generally appreciated that low vacuum, high humidity environments also have negative effects on the imaging performance of the electron microscope. In the presently described example, what is referred to as a Pressure Limiting Aperture (PLA) has been used to separate high vacuum environments, beneficial for electron microscopy, from low vacuum environments, beneficial for ESEM techniques.

The combination of electron microscopes with optical elements for Raman spectroscopy or Cathodoluminescence detection and PLA's is well known, an example of which is described in U.S. Pat. No. 7,718,979, titled "Particle-Optical Apparatus for Simultaneous Observing a Sample with Particles and Photons", which is hereby incorporated by reference herein, in its entirety, for all purposes. For example, the '979 patent describes a mirror with a hole in the center positioned between an electron column pole piece and a sample. An electron beam travels from a source, passes through the hole in the mirror, and interacts with the sample. The mirror also has a surface that reflects and redirects light from a light source to the sample and is positioned to collect light from the sample and direct it to a light detector.

However, previously described embodiments also had some serious disadvantages. First, the mirror is limited to use in high vacuum environments and because the mirror used to reflect light is positioned between the sample and the electron column pole piece, the mirror significantly reduces the ability of the electrons to reach the electron column pole piece from the sample and thus significantly reduces the efficiency of the electron microscope detectors. Further, it is very desirable to keep the working distance of the electron beam path as short as possible. However, previously described PLA configurations increased the working distance thus degrading the imaging performance of the electron microscope.

Therefore, a design of an electron microscope configured to enable Raman Spectroscopy in a low vacuum environment without the negative impacts from signal blockage and increased working distances would provide a significant advantage over previous embodiments.

SUMMARY

Systems, methods, and products to address these and other needs are described herein with respect to illustrative, non-limiting, implementations. Various alternatives, modifications and equivalents are possible.

An embodiment of electron microscope system is described that comprises an electron column pole piece and a light guide assembly operatively coupled together. The light guide assembly also includes one or more detectors, and a mirror with a pressure limiting aperture through which an electron beam from an electron source passes. The mirror is also configured to reflect light, as well as to collect back scattered electrons and secondary electrons.

In some implementations of the electron microscope system the electron column pole piece and the light guide assembly are positioned within a chamber with a low vacuum environment, and the electron beam passes to a sample that produces the back scattered and the secondary electrons in response to the electron beam. Also, in some cases the light guide assembly is operatively coupled to an electron lens of the electron column pole piece.

Also, the light guide assembly and the electron column pole piece may be configured to operatively couple with a pressure tight seal. More specifically, the mirror can provide the pressure tight seal to the electron column pole piece. Alternatively, the light guide assembly and an intermediate element may be configured to operatively couple with a pressure tight seal, and the intermediate element and the electron column pole piece may be configured to operatively couple with a pressure tight seal.

Further, the mirror may be configured to reflect light from the sample to a light detector, as well as to reflect light from a light source to a sample. The light source may include a laser or light emitting diode (LED). The mirror may also be configured to convert the back scattered electrons to secondary electrons, where the light guide assembly may also further include a collection electrode configured to collect the converted secondary electrons. In particular, the collection electrode may comprise a front plate with an aperture through which the back scattered and secondary electrons travel to the mirror.

Last, in some implementations the light guide assembly may further comprise an electrode configured to collect secondary electrons, and in some instances the one or more detectors comprise one or more solid state diode detectors.

Also, an embodiment of a light guide assembly is described that comprises a mirror that includes a pressure limiting aperture through which an electron beam from an electron source passes. The mirror is also configured to reflect light and to collect back scattered and secondary electrons.

In some cases, the mirror and an electron column pole piece are configured to operatively couple with a pressure tight seal. Sometimes, the mirror is configured to operatively couple to an electron lens of the electron pole piece. Alternatively, the mirror and an intermediate element are configured to operatively couple with a pressure tight seal, and the intermediate element and an electron column pole piece are configured to operatively couple with a pressure tight seal. Also, the electron beam passes to a sample positioned in a chamber, wherein the sample produces the back scattered and the secondary electrons in response to the electron beam.

Additionally, the mirror may be configured to reflect light from the sample to a light detector, and to reflect light from a light source to a sample. In some cases, the light source comprises a laser or light emitting diode (LED). Also, the mirror may be configured to convert the back scattered electrons to secondary electrons.

Sometimes, the light guide assembly also includes a collection electrode configured to collect the secondary electrons converted from back scattered electrons by the mirror, which may include a front plate with an aperture through which the back scattered and secondary electrons travel to the mirror. The light guide assembly may also include one or more detectors configured to detect back scattered electrons as well as another electrode configured to collect secondary electrons. In particular, the one or more detectors may be solid state diode detectors.

The above embodiments and implementations are not necessarily inclusive or exclusive of each other and may be combined in any manner that is non-conflicting and otherwise possible, whether they are presented in association with a same, or a different, embodiment or implementation. The description of one embodiment or implementation is not intended to be limiting with respect to other embodiments and/or implementations. Also, any one or more function, step, operation, or technique described elsewhere in this specification may, in alternative implementations, be combined with any one or more function, step, operation, or technique described in the summary. Thus, the above embodiment and implementations are illustrative rather than limiting.

BRIEF DESCRIPTION OF THE DRAWINGS

The above and further features will be more clearly appreciated from the following detailed description when taken in conjunction with the accompanying drawings. In the drawings, like reference numerals indicate like structures, elements, or method steps and the leftmost digit of a reference numeral indicates the number of the figure in which the references element first appears (for example, element 110 appears first in FIG. 1). All of these conventions, however, are intended to be typical or illustrative, rather than limiting.

Like reference numerals refer to corresponding parts throughout the several views of the drawings.

DETAILED DESCRIPTION OF EMBODIMENTS

As will be described in greater detail below, embodiments of the described invention include a scanning electron microscope enabled for Raman Spectroscopy or Cathodoluminescence detection. More specifically, the scanning electron microscope is configured with a light guide assembly that detects back scattered and secondary electrons at short working distances.

Figure 1:
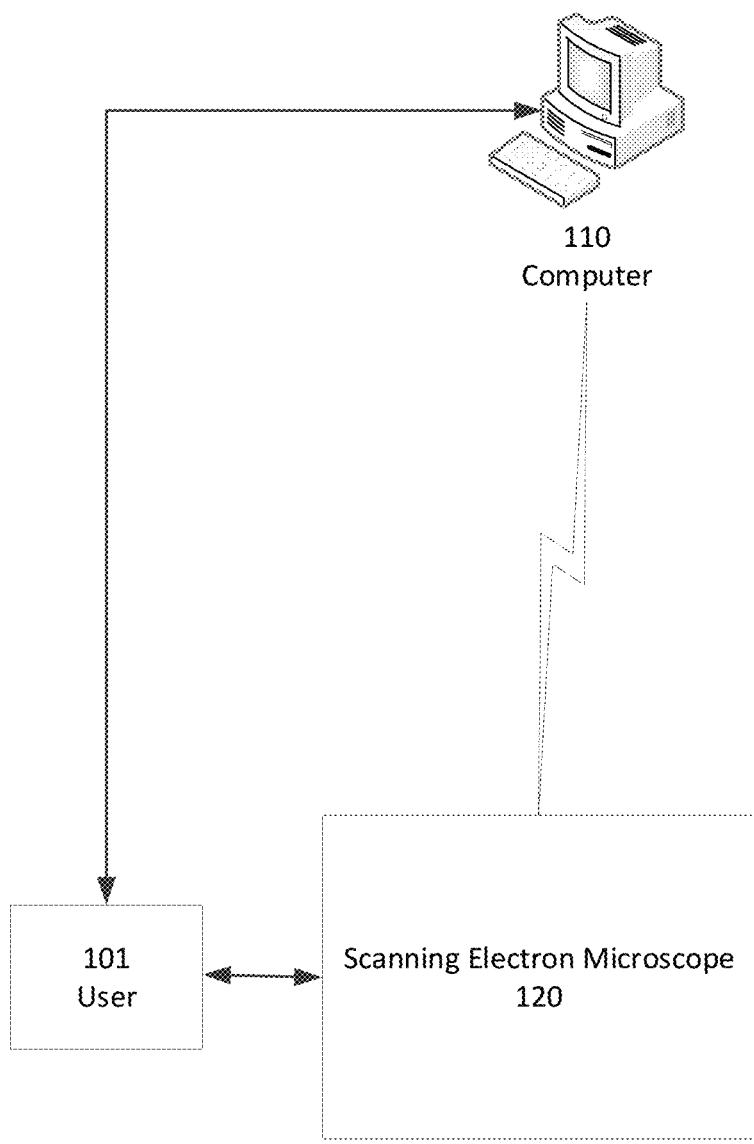
FIG. 1 is a simplified graphical representation of one embodiment of a scanning electron microscope in communication with a computer.

FIG. 1 provides a simplified illustrative example of user 101 capable of interacting with computer 110 and scanning electron microscope 120. Embodiments of scanning electron microscope 120 may include a variety of commercially available scanning electron microscopes. For example, scanning electron microscope 120 may include the Quattro or Prisma scanning electron microscopes both available from Thermo Fisher Scientific. FIG. 1 also illustrates a network connection between computer 110 and scanning electron microscope 120, however it will be appreciated that FIG. 1 is intended to be exemplary and additional or fewer network connections may be included. Further, the network connection between the elements may include "direct" wired or wireless data transmission (e.g. as represented by the lightning bolt) as well as "indirect" communication via other devices (e.g. switches, routers, controllers, computers, etc.) and therefore the example of FIG. 1 should not be considered as limiting.

Computer 110 may include any type of computing platform such as a workstation, a personal computer, a tablet, a "smart phone", one or more servers, compute cluster (local or remote), or any other present or future computer or cluster of computers. Computers typically include known components such as one or more processors, an operating system, system memory, memory storage devices, input-output controllers, input-output devices, and display devices. It will also be appreciated that more than one implementation of computer 110 may be used to carry out various operations in different embodiments, and thus the representation of computer 110 in FIG. 1 should not be considered as limiting.

In some embodiments, computer 110 may employ a computer program product comprising a computer usable medium having control logic (e.g. computer software program, including program code) stored therein. The control logic, when executed by a processor, causes the processor to perform some or all of the functions described herein. In other embodiments, some functions are implemented primarily in hardware using, for example, a hardware state machine. Implementation of the hardware state machine so as to perform the functions described herein will be apparent to those skilled in the relevant arts. Also in the same or other embodiments, computer 110 may employ an internet client that may include specialized software applications enabled to access remote information via a network. A network may include one or more of the many types of networks well known to those of ordinary skill in the art. For example, a network may include a local or wide area network that may employ what is commonly referred to as a TCP/IP protocol suite to communicate. A network may include a worldwide system of interconnected computer networks that is commonly referred to as the internet, or could also include various intranet architectures. Those of ordinary skill in the related art will also appreciate that some users in networked environments may prefer to employ what are generally referred to as "firewalls" (also sometimes referred to as Packet Filters, or Border Protection Devices) to control information traffic to and from hardware and/or software systems. For example, firewalls may comprise hardware or software elements or some combination thereof and are typically designed to enforce security policies put in place by users, such as for instance network administrators, etc.

As described herein, embodiments of the described invention include a scanning electron microscope configured with a light guide assembly comprising a mirror configured with a PLA, and that collects back scattered and secondary electrons at short working distances.

Figure 2:
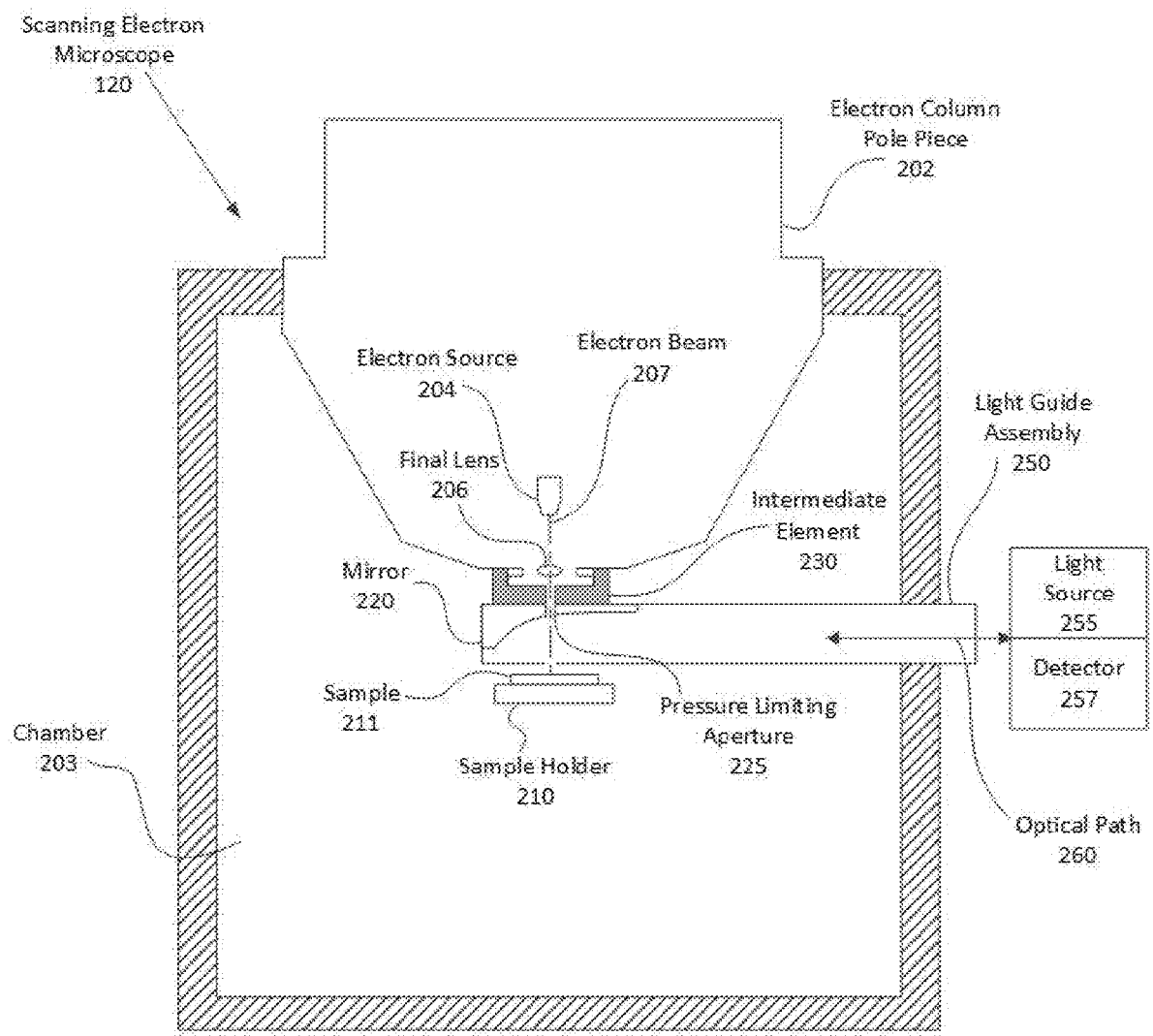
FIG. 2 is a simplified graphical representation of one embodiment of the scanning electron microscope of FIG. 1 with a light guide assembly.

FIG. 2 provides an illustrative example that shows an embodiment of scanning electron microscope 120 that includes chamber 203 and electron column pole piece 202. Embodiments of electron column pole piece 202 include any type of electron column pole piece (sometime referred to as an electron column or a pole piece) typically found with an embodiment of scanning electron microscope 120 and generally include elements such as one or more coils and/or one or more electromagnetic lenses such as final lens 206 for focusing electron beam 207 from electron source 204. It will also be appreciated that FIG. 2 is for illustration purposes and should not be considered as limiting. For example, FIG. 2 illustrates final lens 206 as an ellipse, however electromagnetic lenses include various configurations and shapes.

The environment within chamber 203 may include a high vacuum environment, however as described above it may be desirable to operate chamber 203 with a low vacuum or ESEM environment. For example, chamber 203 may include a pressure of about 1 mbar which is sufficient to remove charge from the surface of non-conductive samples irradiated by electron beam. In some cases, chamber 203 may have a pressure substantially equivalent to water vapor of about 6 mbar that may be used in combination with an embodiment of sample holder 210 with cooling features to achieve equilibrium pressure (100% relative humidity) of water. Chamber 203 may include pressures up to about 40 mbar to achieve water vapor equilibrium pressure at a room temperature of about 25° C. or higher. It will, however, be appreciated that the equilibrium pressure of water depends on the temperature of the environment and thus different pressures may be used.

Sample holder 210 is typically employed for positioning sample 211 in the path of electron beam 207 as well as within the field of view of mirror 220. It will be appreciated by those of ordinary skill in the art that sample 211 may include any type of sample such as, for example, a biological sample. FIG. 2 also provides an illustrative example of light guide assembly 250 that includes mirror 220 with pressure limiting aperture 225 positioned to allow electron beam 207 to pass through. Those of ordinary skill in the related art appreciate that ESEM microscopes typically use two pressure limiting apertures. For example, one pressure limiting aperture may be located inside an objective lens (e.g. final lens 206) which may have a small diameter as the influence on the field view is weaker, and a second pressure limiting aperture in position close to sample, such as pressure limiting aperture 225, which then limits the field of view. The diameter of pressure limiting aperture 225 is therefore optimized for good orientation of the field of view in relation to sample 211 at lower magnifications. In the embodiments described herein, the diameter of pressure limiting aperture 225 is sufficiently small so that a pressure differential can be maintained between chamber 203 and the environment that includes electron source 205. For example, the diameter of pressure limiting aperture 225 may be in the range of 500 $\mu$m-1 mm, but typically more than about 300 $\mu$m. As described above, the pressure in chamber 203 may include a low vacuum pressure of about 30 mbar separated by pressure limiting aperture 225 from the environment that includes electron source 205 that may include a high vacuum pressure below about 0.1 mbar (e.g. to limit the degree of electron scattering that can occur at lower vacuum pressures). In the presently described example, vacuum pressures can be maintained using well known techniques (e.g. vacuum pumps, etc.).

In the embodiments described herein, mirror 220 of light guide assembly 250 is coupled to electron column pole piece 202 with a pressure tight seal. In some cases, light guide assembly 250 is coupled to final lens 206 of electron column pole piece 202 with a pressure tight seal. Also, in some embodiments formation of the pressure tight seal can be improved by using intermediate element 230 constructed of a desirable material and configured to interface with electron column pole piece 202 or final lens 206 and mirror 220 without gaps (e.g. there is a pressure tight seal between mirror 220 and intermediate element 230 as well as a pressure tight seal between intermediate element 230 and electron column pole piece 202 or final lens 206). It will also be appreciated that in some embodiments pressure limiting aperture 225 may be associated with intermediate element 230 rather than mirror 220, however it is desirable to position pressure limiting aperture 225 as close to sample 211 as possible to shorten the path of electron beam 207 in the environment of chamber 203. For example, intermediate element 230 may be constructed from non-magnetic material so that electron beam 207 does not deteriorate. When mirror 220 is biased with an electric charge, intermediate element 230 should provide galvanic separation (e.g. isolation to prevent flow of electric current) of mirror 220 and the objective lens in pole piece 204. In some cases light guide assembly 250 may be configured to provide the galvanic separation. In the presently described example, intermediate element 230 is not irradiated by electron beam 207 that could charge intermediate element 230 and deteriorate quality of electron beam 207.

Also, as described above it is an important aspect of the presently described invention to keep the working distance between electron column pole piece 202 and sample 211 as short as possible to limit beam spreading, but with sufficient distance to a detection element to allow for what is referred to as "cascade amplification" of secondary electrons to form. For example, "cascade amplification" may occur in a mode of operation where water vapor is present. Secondary electrons interact with the water molecules to produce additional secondary electrons, which in turn interact with adjacent water molecules producing more secondary electrons, thereby "amplifying" the number of secondary electrons. It will, however, be appreciated that water vapor is not required for cascade amplification to occur. As described above, it is highly desirable to optimally position sample holder 210 close to light guide assembly 250. For example, in a low vacuum environment a desirable working distance between pressure limiting aperture 225 and sample 211 may include a distance in the range of about 10-20 mm.

FIG. 2 also illustrates light source 255 that may include any type of light source known to those of ordinary skill in the art for Raman spectroscopy (e.g. a laser, LED, or other type of source). Similarly, FIG. 2 illustrates detector 257 that may include any type of detector known to those of ordinary skill in the art for Raman spectroscopy (e.g. a CCD, photomultiplier, or other type of detector). It will be appreciated that various optical elements known to those in the art may typically be employed to direct light (not shown, e.g. mirrors, beam conditioning elements, and/or lenses) along optical path 260 between light source 255/detector 257 and sample 211 via mirror 220, as well as to condition the characteristics of the light for desirable Raman spectroscopy performance.

Figure 3A:
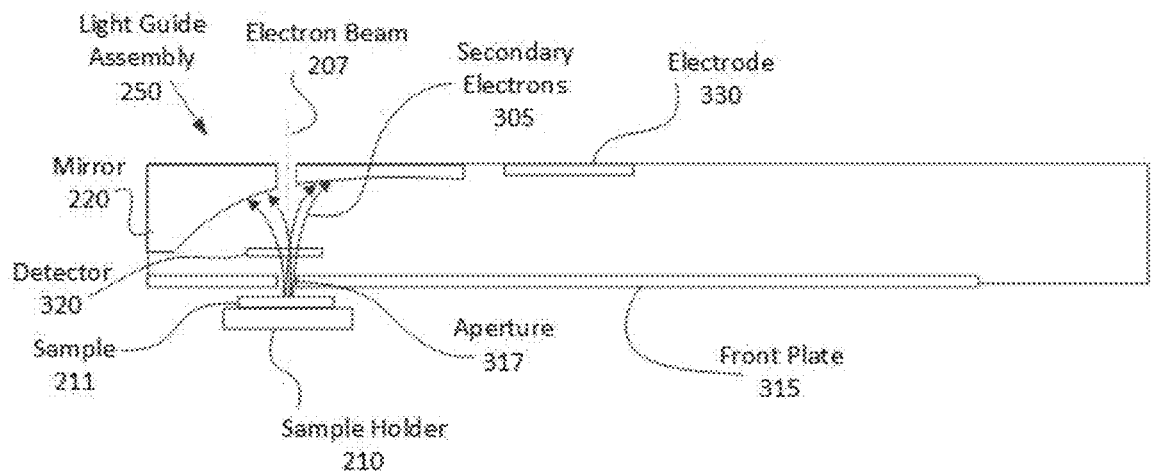
FIG. 3A is a simplified graphical representation of one embodiment of a side view of the light guide assembly of FIG. 2 operating in a mode where a mirror collects secondary electrons at pressures greater than about 1 mbar.

FIG. 3A provides an illustrative example showing a side view of light guide assembly 250 with a mirror 220 that acts as a Gaseous Secondary Electron Detector (GSED) and collects secondary electrons 305 shed from the surface of sample 211 in response to electron beam 207 when scanning electron microscope 120 operates in a mode where the pressure in chamber 203 is greater than about 1-2 mbar. For example, electron beam 207 comprises primary electrons that interact with the surface of sample 211 creating secondary electrons 305 that leave sample 211 and travel towards mirror 220 that has a positive electric charge (e.g. may include about a 600 V positive bias) in the mode of operation. In the present example, electrode 330 and/or front plate 315 may include a substantially neutral charge so that secondary electrons efficiently travel to mirror 220 (front plate 315 may include a very small positive bias).

Figure 3B:
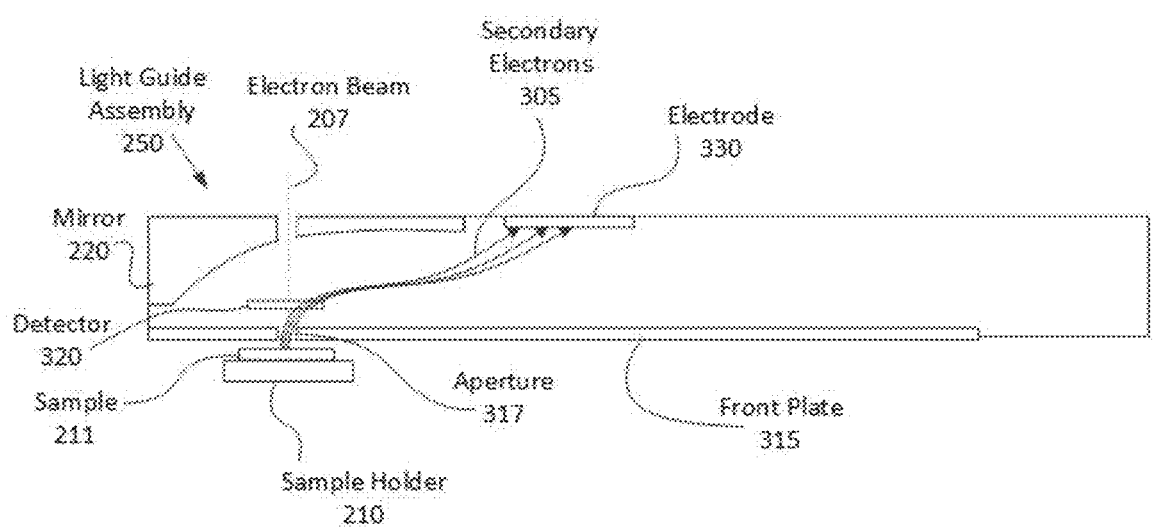
FIG. 3B is a simplified graphical representation of one embodiment of a side view of the light guide assembly of FIG. 2 operating in a mode where an electrode collects secondary electrons at pressures less than about 1 mbar

FIG. 3B provides an illustrative example showing a side view of light guide assembly 250 when scanning electron microscope 120 operates in a mode where chamber 203 includes a pressure lower than 1 mbar. For example, chamber 203 may include a pressure of about 0.5 mbar, where it may be desirable to extend the distance between sample 211 and a detector to produce a larger signal through cascade amplification. In such a mode, secondary electrons 305 are not collected by mirror 220, rather secondary electrons 305 are collected and detected by electrode 330 which is positively biased instead of mirror 220 that includes a substantially neutral bias (may include a very small negative bias). In the presently described example, electrode 330 may be spaced some distance away from mirror 220 that provides additional time and space for cascade amplification to occur. Further, light guide assembly 250 may include front plate 315 that includes a substantially neutral bias (may include a very small negative bias) with aperture 317 through which electron beam 207 and secondary electrons 305 from sample 211 pass.

Figure 4A:
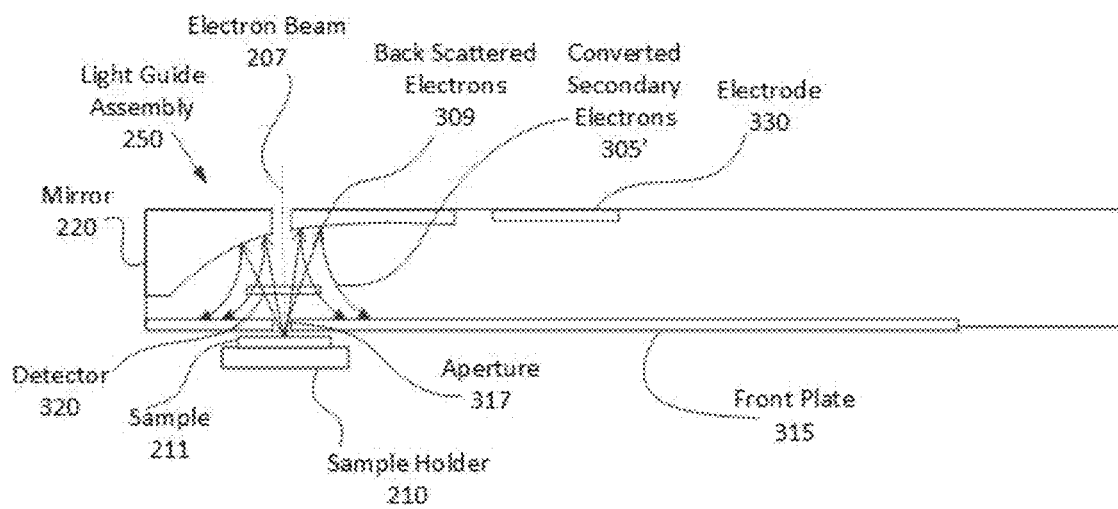
FIG. 4A is a simplified graphical representation of one embodiment of a side view of the light guide assembly of FIG. 2 operating in a mode where a mirror collects back scattered electrons and converts them to secondary electrons that are collected by a front plate electrode at pressures greater than about 1 mbar.

FIG. 4A provides an illustrative example showing the side view of the light guide assembly 250 when scanning electron microscope 120 operates in a mode where the pressure in chamber 203 is greater than about 1 mbar where mirror 220 acts as a conversion electrode for back scattered electrons 309. For example, back scattered electrons 309 are collected by mirror 220 that comprises a negative bias and produces converted secondary electrons 305' by a known process which are released from mirror 220. Converted secondary electrons 305' are then collected and detected by front plate 315 that acts as a Gaseous Back-Scattered Detector (GBSD) collection electrode (e.g. with a substantially neutral bias but may include a very small negative bias). In the example presented in FIG. 4A, electrode 330 may include a negative bias.

Figure 4B:
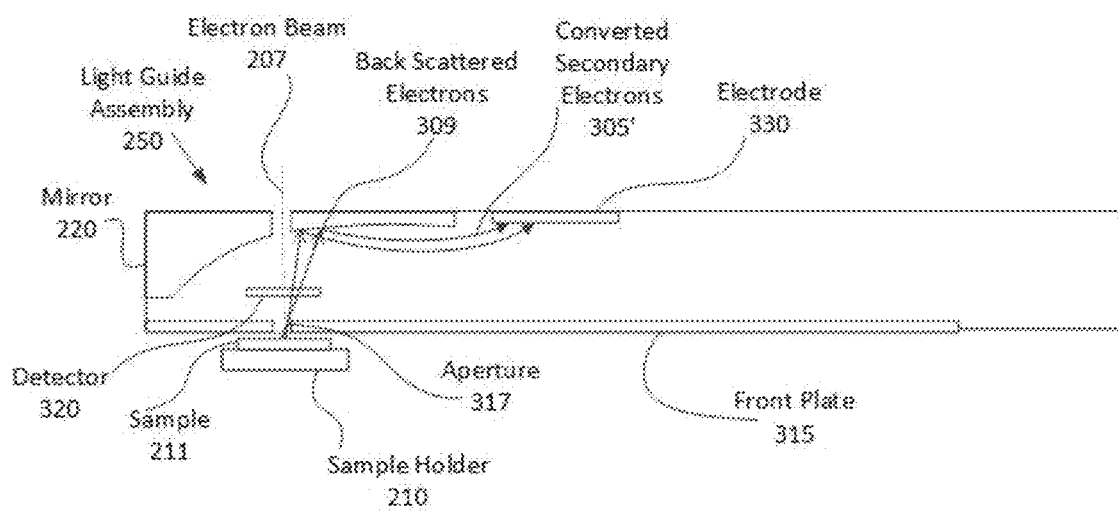
FIG. 4B is a simplified graphical representation of one embodiment of a side view of the light guide assembly of FIG. 2 operating in a mode where a mirror collects back scattered electrons and converts them to secondary electrons that are collected by an electrode at pressures less than about 1 mbar.

FIG. 4B provides an illustrative example showing a side view of light guide assembly 250 when scanning electron microscope 120 operates in a mode where chamber 203 includes a pressure lower than about 1 mbar. Similar to the embodiment of FIG. 3B, chamber 203 may include a pressure where it may be desirable to produce a larger signal using cascade amplification, and thus converted secondary electrons 305' are collected and detected by electrode 330 which may include a substantially positive bias (e.g. mirror 220 may include a substantially negative bias, and front plate 315 may include a substantially neutral bias with a very small negative bias).

For the embodiments of both 4A and 4B, converted secondary electrons 305' may be further amplified by cascade amplification within the internal environment of light guide assembly 250. For example, the internal environment of light guide assembly 250 may be substantially the same as the environment within chamber 203, that when operated in ESEM mode may include a high degree of relative humidity (e.g. a RH of about 100%). Therefore, converted secondary electrons 305' traveling from mirror 220 to front plate 315 (as in FIG. 4A) or to electrode 330 (as in FIG. 4B) increase in number by cascade amplification within the internal environment of light guide assembly 250.

Figure 4C:
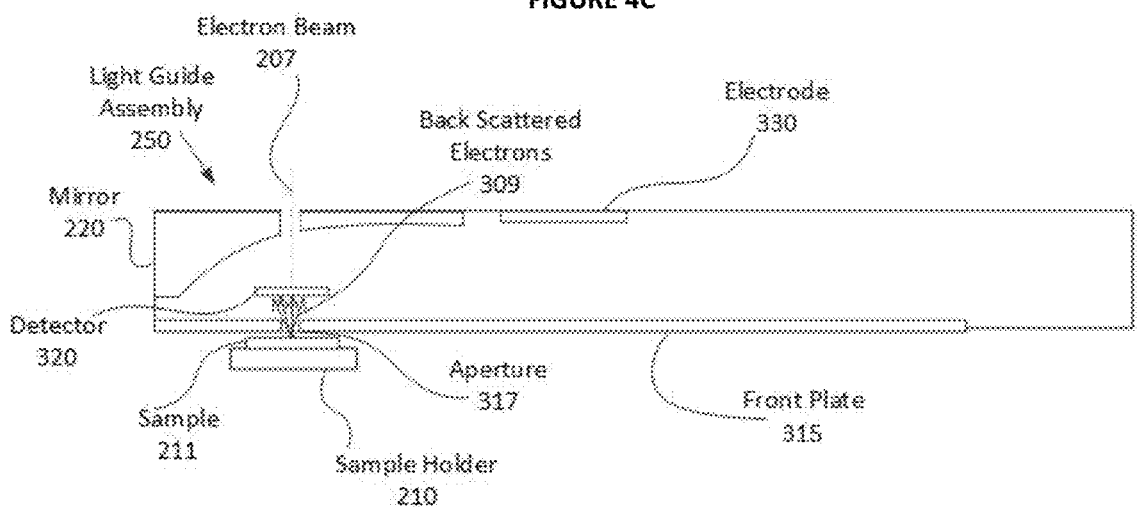
FIG. 4C is a simplified graphical representation of one embodiment of a side view of the light guide assembly of FIG. 2 operating in a mode where a detector collects back scattered electrons in a high vacuum environment.
Figure 5:
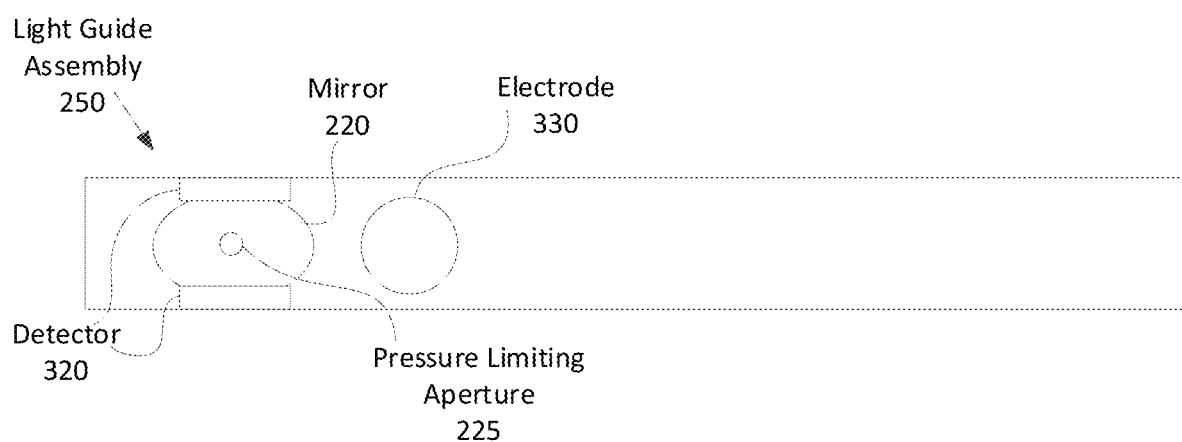
FIG. 5 is a simplified graphical representation of one embodiment of a view from the bottom of the light guide assembly of FIG. 2 (e.g. a view looking towards an electron column pole piece) with one or more detectors.

In some embodiments, as illustrated in the example of FIG. 4C, back scattered electrons 309 can be detected by detector 320 that may include any type of detector known in the art such as, for example, what are referred to as solid state detectors. This may be desirable in situations when the pressure in chamber 203 and in lightguide assembly 250 do not provide sufficient amplification between mirror 220 and front plate 315 and/or in high vacuum conditions. It will also be appreciated that there may two or more embodiments of detector 320 positioned in light guide assembly 250, such as the two embodiments illustrated in the example of FIG. 5 that provides a view from the bottom of the light guide assembly 250 (e.g. a view looking towards electron column pole piece 202 without front plate 315). Notably, the implementations of detector 320 may be positioned laterally relative to mirror 220 so that the path of secondary electrons 305 and/or back scattered electrons 309 from sample 211 to mirror 220 is not blocked by detector 320. Also, it may be desirable to position detector 320 some distance above front plate 315 to enable better collection efficiency of back scattered electrons 309.

It will also be appreciated that the pressure in chamber 203 may vary in some embodiments, such as a pressure that may be higher or lower for the mode of operation as described for FIGS. 3A-B, 4A-C, and 5. In some cases, the variation in pressure may have an impact on performance but may also provide other advantages and thus is considered within the scope of the described invention. Further, mirror 220 is illustrated if the example of FIG. 5 as having a substantially ellipsoidal shape, however mirror 220 may include any shape that effectively directs light from light source 255 to sample 211. It is also important that the shape of mirror 220 is effective for collecting light from sample 211 (e.g. Raman emissions or cathodoluminescence) and directing the light to detector 257. It is further desirable that the working distances within light guide assembly 250 are as short as possible. Therefore, it will be appreciated that the embodiments of FIGS. 2, 3A-B, 4A-C, and 5 are for illustrative purposes and should not be considered as limiting.

Having described various embodiments and implementations, it should be apparent to those skilled in the relevant art that the foregoing is illustrative only and not limiting, having been presented by way of example only. Many other schemes for distributing functions among the various functional elements of the illustrated embodiments are possible. The functions of any element may be carried out in various ways in alternative embodiments

The invention claimed is:

1. An electron microscope system, comprising:
an electron pole piece; and
a light guide assembly operatively coupled to the electron column pole piece and comprising one or more detectors, and a mirror that includes a pressure limiting aperture through which an electron beam from an electron source passes, wherein the mirror is configured to reflect light, to collect back scattered electrons and secondary electrons, and to convert the back scattered electrons to secondary electrons.

2. The electron microscope system of claim 1, further comprising:
a chamber that comprises a low vacuum environment, wherein the electron column pole piece and the light guide assembly are positioned within the chamber.

3. The electron microscope system of claim 2, wherein:
the electron beam passes to a sample positioned in the chamber, wherein the sample produces the back scattered and the secondary electrons in response to the electron beam.

4. The electron microscope system of claim 1, wherein:
the light guide assembly is operatively coupled to a final lens of the electron column pole piece.

5. The electron microscope system of claim 1, wherein:
the light guide assembly and the electron column beam pole piece are configured to operatively couple with a pressure tight seal.

6. The electron microscope system of claim 5, wherein:
the mirror provides the pressure tight seal to the electron column beam pole piece.

7. The electron microscope system of claim 5, wherein:
the light guide assembly and an intermediate element are configured to operatively couple with a pressure tight seal, and the intermediate element and the electron column pole piece are configured to operatively couple with a pressure tight seal.

8. The electron microscope system of claim 1, wherein:
the mirror is configured to reflect light from the sample to a light detector.

9. The electron microscope system of claim 8, wherein:
the mirror is configured to reflect light from a light source, such as a laser or a light emitting diode (LED) to a sample.

10. The electron microscope system of claim 1, wherein:
the light guide assembly further comprises a collection electrode configured to collect the converted secondary electrons.

11. The electron microscope system of claim 10, wherein:
the collection electrode comprises a front plate, wherein the front plate comprises an aperture through which the back scattered and secondary electrons travel to the mirror.

12. The electron microscope system of claim 1, wherein:
the light guide assembly further comprises an electrode configured to collect secondary electrons.

13. The electron microscope system of claim 1, wherein:
the one or more detectors are configured to detect back scattered electrons, wherein the one or more detectors comprise one or more solid state diode detectors.

14. A light guide assembly, comprising:
a mirror that includes a pressure limiting aperture through which an electron beam from an electron source passes, wherein the mirror is configured to reflect light, to collect back scattered electrons and secondary electrons, and to convert the back scattered electrons to secondary electrons.

15. The light guide assembly of claim 14, wherein:
the mirror and an electron column pole piece are configured to operatively couple with a pressure tight seal.

16. The light guide assembly of claim 15, wherein:
the mirror is configured to operatively couple to a final lens of the electron column pole piece.

17. The light guide assembly of claim 14, further comprising:
the mirror and an intermediate element are configured to operatively couple with a pressure tight seal, and the intermediate element and an electron column pole piece are configured to operatively couple with a pressure tight seal.

18. The light guide assembly of claim 14, wherein:
the electron beam passes to a sample positioned in a chamber comprising a low vacuum environment, wherein the light guide assembly and an electron pole piece are positioned within the chamber and the sample produces the back scattered and the secondary electrons in response to the electron beam.

19. The light guide assembly of claim 14, wherein:
the mirror is configured to reflect light from the sample to a light detector.

20. The light guide assembly of claim 14, wherein:
the mirror is configured to reflect light from a light source to a sample, wherein the light source comprises a laser or light emitting diode (LED).

21. The light guide assembly of claim 14, further comprising:
a collection electrode configured to collect the converted secondary electrons.

22. The light guide assembly of claim 21, wherein:
the collection electrode comprises a front plate, wherein the front plate comprises an aperture through which the back scattered and secondary electrons travel to the mirror.

23. The light guide assembly of claim 14, further comprising:
an electrode configured to collect secondary electrons.

24. The light guide assembly of claim 14, further comprising:
one or more detectors configured to detect back scattered electrons, wherein the one or more detectors comprise one or more solid state diode detectors.

25. An electron microscope system, comprising:
an electron pole piece; and
a light guide assembly operatively coupled to the electron column pole piece and comprising one or more detectors, and a mirror that includes a pressure limiting aperture through which an electron beam from an electron source passes, wherein the mirror is configured to reflect light from a light source comprising a laser or a light emitting diode (LED) to a sample and from the sample to a light detector, and the mirror is further configured to collect back scattered electrons and secondary electrons.

26. A light guide assembly, comprising:
a mirror that includes a pressure limiting aperture through which an electron beam from an electron source passes, wherein the mirror is configured to reflect light from a light source comprising a laser or a light emitting diode (LED) to a sample and from the sample to a light detector, and the mirror is further configured to collect back scattered electrons and secondary electrons.

\* \* \* \* \*